United States Patent
Son

(10) Patent No.: US 9,715,996 B2
(45) Date of Patent: Jul. 25, 2017

(54) ADJUSTABLE CAPACITOR, PLASMA IMPEDANCE MATCHING DEVICE, PLASMA IMPEDANCE MATCHING METHOD, AND SUBSTRATE TREATING APPARATUS

(75) Inventor: Dukhyun Son, Chungcheongnam-do (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 1610 days.

(21) Appl. No.: 13/337,878

(22) Filed: Dec. 27, 2011

(65) Prior Publication Data

US 2012/0168081 A1    Jul. 5, 2012

(30) Foreign Application Priority Data

Dec. 30, 2010  (KR) .................. 10-2010-0139484
May 4, 2011    (KR) .................. 10-2011-0042697

(51) Int. Cl.
*H01J 37/32* (2006.01)
*H01G 5/16* (2006.01)
*H05H 1/46* (2006.01)

(52) U.S. Cl.
CPC ......... *H01J 37/32183* (2013.01); *H01G 5/16* (2013.01); *H01J 37/321* (2013.01); *H01J 37/32091* (2013.01); *H01J 37/32174* (2013.01); *H05H 1/46* (2013.01); *H05H 2001/4682* (2013.01)

(58) Field of Classification Search
CPC ...... H01G 4/40; H01G 5/38; H03H 2210/025; H01J 37/32174; H01J 37/32183

USPC .................. 307/109; 327/554; 361/328, 329
See application file for complete search history.

(56) References Cited

U.S. PATENT DOCUMENTS

| | | | | |
|---|---|---|---|---|
| 3,571,778 A | * | 3/1971 | Smith, Jr. ................ | H01C 7/00 338/200 |
| 4,375,051 A | * | 2/1983 | Theall ............... | H01J 37/32174 327/518 |
| 4,679,007 A | * | 7/1987 | Reese ............... | H01J 37/32183 333/17.3 |

(Continued)

FOREIGN PATENT DOCUMENTS

| | | |
|---|---|---|
| CN | 1075249 C | 11/2001 |
| CN | 1122361 C | 9/2003 |

(Continued)

*Primary Examiner* — Fritz M Fleming
(74) *Attorney, Agent, or Firm* — Harness, Dickey & Pierce, P.L.C.

(57) ABSTRACT

Disclosed is a substrate treating apparatus which comprises a process chamber; an electrode configured to generate plasma from a gas supplied into the process chamber; an RF power supply configured to output an RF power; a transmission line configured to transmit the RF power to the electrode from the RF power supply; an impedance matching unit connected to the transmission line and configured to match plasma impedance; and a controller configured to output a control signal to the impedance matching unit, wherein the impedance matching unit comprises an adjustable capacitor having a plurality of capacitors and a plurality of switches corresponding to the plurality of capacitors, the plurality of switches being switched on/off according to the control signal so that capacitance of the adjustable capacitor is adjusted.

27 Claims, 16 Drawing Sheets

(56) References Cited

U.S. PATENT DOCUMENTS

| | | | | |
|---|---|---|---|---|
| 5,053,725 A * | 10/1991 | Gesche | ............ | H01J 37/32183 333/17.3 |
| 5,187,457 A * | 2/1993 | Chawla | ............ | H01J 37/32174 333/170 |
| 5,654,679 A * | 8/1997 | Mavretic | .................. | H03H 7/40 333/17.3 |
| 6,181,218 B1 * | 1/2001 | Clark | ....................... | H03B 5/32 331/177 R |
| 6,285,095 B1 * | 9/2001 | Becker | ................... | G01R 15/06 307/125 |
| 6,992,543 B2 * | 1/2006 | Luetzelschwab | ......... | H03F 1/56 330/195 |
| 2003/0206066 A1 * | 11/2003 | Harwood | ............ | H03L 7/0893 331/17 |
| 2004/0214543 A1 * | 10/2004 | Osone | ..................... | H01G 5/16 455/197.2 |
| 2007/0217525 A1 | 9/2007 | Vrcelj et al. | | |
| 2008/0179948 A1 * | 7/2008 | Nagarkatti | ........ | H01J 37/32183 307/18 |

FOREIGN PATENT DOCUMENTS

| | | |
|---|---|---|
| CN | 101057310 A | 10/2007 |
| CN | 101509646 A | 8/2009 |
| JP | 2001230207 A | 8/2001 |
| JP | 2002-164762 | 6/2002 |
| JP | 2003298378 A | 10/2003 |
| JP | 2007-266374 | 10/2007 |
| KR | 1990-0005438 | 6/1990 |
| KR | 10-2000-0016599 | 3/2000 |
| KR | 1020050089114 A | 9/2005 |
| KR | 10-2008-0113962 | 12/2008 |
| KR | 10-0996764 B1 | 12/2008 |
| KR | 10-0915613 B1 | 9/2009 |
| TW | 424394 | 3/2001 |
| TW | 234418 | 6/2005 |
| WO | WO-9748183 A1 | 12/1997 |
| WO | WO-2007053569 A1 | 5/2007 |

* cited by examiner

ADJUSTABLE CAPACITOR, PLASMA IMPEDANCE MATCHING DEVICE, PLASMA IMPEDANCE MATCHING METHOD, AND SUBSTRATE TREATING APPARATUS

CROSS-REFERENCE TO RELATED APPLICATIONS

A claim for priority under 35 U.S.C. §119 is made to Korean Patent Application Nos. 10-2010-0139483 filed Dec. 30, 2010, and 10-2011-0042697 filed May 4, 2011, the entirety of which is incorporated by reference herein.

BACKGROUND

The inventive concepts described herein relate to an adjustable capacitor, a plasma impedance matching device, a plasma impedance matching method, and a substrate treating apparatus, and more particularly, relate to an adjustable capacitor capable of adjusting capacitance, a plasma impedance matching device capable of matching plasma impedance in a process apparatus, using plasma, of a semiconductor fabricating equipment, a plasma impedance matching method, and a substrate treating apparatus.

A plasma impedance matching device uses a Radio Frequency (RF) power, and is an impedance matching device for enabling a maximum RF power to be transferred to a plasma process chamber. Thus, the plasma impedance matching device may be a principal device to generate and maintain plasma.

When a power generated by an RF power supply is supplied to a process chamber for generating plasma, impedance of a power supply and plasma impedance must be matched to transfer a maximum power without a reflected wave. This operation is generally called impedance matching.

Plasma impedance being an electric characteristic is varied according to conditions such as pressure, RF power, source gas, and the like. In case that the plasma impedance is not matched with impedance of the RF power supply, it is difficult to supply a power constantly. This causes a variation in a plasma density at processing. As a result, a difference of process results becomes large. For this reason, impedance matching may be considered to transfer the RF power to the process chamber constantly. For this, an impedance matching device is disposed between the RF power supply and a plasma generating device within the process chamber.

A conventional impedance matching device is formed of an adjustable capacitor and an inductor. Impedance of the RF power supply is matched with impedance of the process chamber by adjusting capacitance of the adjustable capacitor.

Capacitance of the adjustable capacitor within the conventional impedance matching device is varied by adjusting an interval of the capacitor using a driving means formed of a stepping motor and a gear stage. Impedance of the RF power supply is varied by adjusting capacitance of the adjustable capacitor.

In case that capacitance of the capacitor is adjusted by a mechanical driving means, a time delay becomes longer by an operating time of the mechanical driving means, and it is difficult to control capacitance finely. In particular, in the event that the RF power supplies a power in a pulse mode, a plasma state is rapidly varied at a high-speed pulse. For this reason, it is difficult to perform impedance matching rapidly. Further, the RF power may be supplied in a pulse mode where an RF power supply voltage becomes periodically on and off according to a time. In this case, although the pulse mode is at an off state, a power remaining at the adjustable capacitor is supplied to the process chamber.

SUMMARY

Example embodiments of the inventive concept provides a substrate treating apparatus which comprises a process chamber; an electrode configured to generate plasma from a gas supplied into the process chamber; an RF power supply configured to output an RF power; a transmission line configured to transmit the RF power to the electrode from the RF power supply; an impedance matching unit connected to the transmission line and configured to match plasma impedance; and a controller configured to output a control signal to the impedance matching unit, wherein the impedance matching unit comprises an adjustable capacitor having a plurality of capacitors and a plurality of switches corresponding to the plurality of capacitors, the plurality of switches being switched on/off according to the control signal so that capacitance of the adjustable capacitor is adjusted.

In example embodiments, the plurality of capacitors is grouped into N groups (N being an integer bigger than 1), and capacitance ranges adjusted by the respective groups are different.

In example embodiments, each group includes a plurality of capacitors.

In example embodiments, the groups are connected in parallel.

In example embodiments, a plurality of capacitors in each group is connected in parallel.

In example embodiments, capacitors in the same group haves the same capacitance.

In example embodiments, each group includes nine capacitors.

In example embodiments, a capacitance ratio of the N groups is $10^0:10^1:10^2:10^3 \ldots :10^{n-1}$.

In example embodiments, the RF power supply supplies the RF power in a pulse mode.

In example embodiments, the transmission line comprises a first transmission line connecting the adjustable capacitor and the process chamber; and a second transmission line being diverged from the first transmission line to a ground; wherein the substrate treating apparatus further comprises a first transmission switch provided on the first transmission line; and a second transmission switch provided on the second transmission line; and wherein the controller outputs an on/off signal to the first transmission switch and the second transmission switch according to a pulse mode of the RF power supply.

In example embodiments, the first transmission switch is located after a connection node between the first transmission line and the second transmission line.

Example embodiments of the inventive concept also provides a plasma impedance matching device comprising: an impedance matching unit connected to a transmission line of an RF power and configured to match plasma impedance; and a controller configured to send a control signal to the impedance matching unit, wherein the impedance matching unit comprises an adjustable capacitor having a plurality of capacitors and a plurality of switches corresponding to the plurality of capacitors, the plurality of switches being switched on/off according to the control signal so that capacitance of the adjustable capacitor is adjusted.

In example embodiments, the plurality of capacitors is grouped into N groups (N being an integer bigger than 1), and capacitance ranges adjusted by the respective groups are different.

In example embodiments, each group includes a plurality of capacitors.

In example embodiments, the groups are connected in parallel.

In example embodiments, a plurality of capacitors in each group is connected in parallel.

In example embodiments, capacitors in the same group haves the same capacitance.

In example embodiments, each group includes nine capacitors.

In example embodiments, the switches are formed of a PIN diode.

In example embodiments, the plurality of capacitors is connected in parallel.

In example embodiments, the adjustable capacitor further comprises: a mechanical adjustable capacitor configured to receive the control signal of the controller to adjust capacitance by a mechanical driving means.

Example embodiments of the inventive concept also provides an adjustable capacitor comprising: a plurality of capacitors grouped into N groups (N being an integer bigger than 1); and a plurality of switches respectively connected to the plurality of capacitors and controlled according to a control signal, wherein capacitance ranges adjusted by the respective groups are different.

In example embodiments, each group includes a plurality of capacitors.

In example embodiments, the groups are connected in parallel.

In example embodiments, a plurality of capacitors in each group is connected in parallel.

In example embodiments, capacitors in the same group haves the same capacitance.

In example embodiments, capacitors in different groups have different capacitances.

In example embodiments, each group includes nine capacitors.

In example embodiments, a capacitance ratio of the N groups is $10^0:10^1:10^2:10^3 \ldots :10^{n-1}$.

In example embodiments, the switches are formed of a PIN diode.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
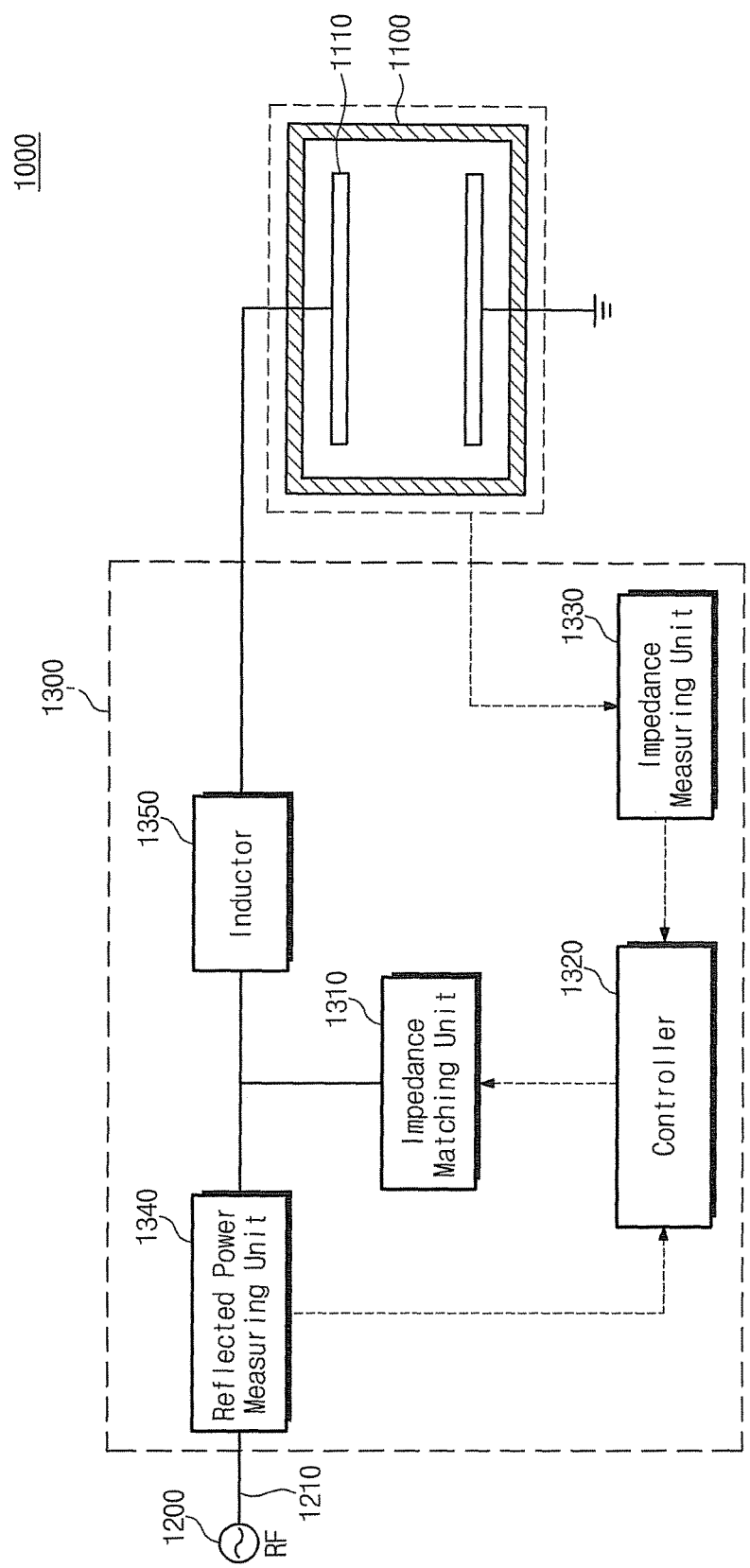
FIG. 1 is a block diagram of a substrate treating apparatus according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, a substrate treating apparatus 1000 according to an embodiment of the inventive concept will be described with reference to accompanying drawings.

FIG. 1 is a block diagram of a substrate treating apparatus according to an embodiment of the inventive concept.

Referring to FIG. 1, a substrate treating apparatus 1000 includes a process chamber 1100, a RF power supply 1200, a transmission line 1210, and a plasma impedance matching device 1300.

The substrate treating apparatus 1000 is configured to generate plasma using a gas within the process chamber 1100 and to treat a substrate using the plasma.

The process chamber 1100 is used to perform a substrate treating process using plasma. The process chamber 1100 includes an electrode 1110.

The electrode 1110 supplies an electric energy such that a gas input into the process chamber is ionized to become a plasma state.

The electrode 1110 may be a Capacitively Coupled Plasma (hereinafter, referred to as CCP) source which is formed of two electrode plates disposed in parallel within the process chamber 1100. The CCP source supplies an electric energy to electrons of the gas input within the process chamber 1100 using a capacitive electric field.

As illustrated in FIG. 1, the CCP source may have such a shape that one of two electrode plates is connected with the RF power supply 1200. A shape of the electrode 1110 and connection with the RF power supply 1200 are not limited to this disclosure.

Figure 2:
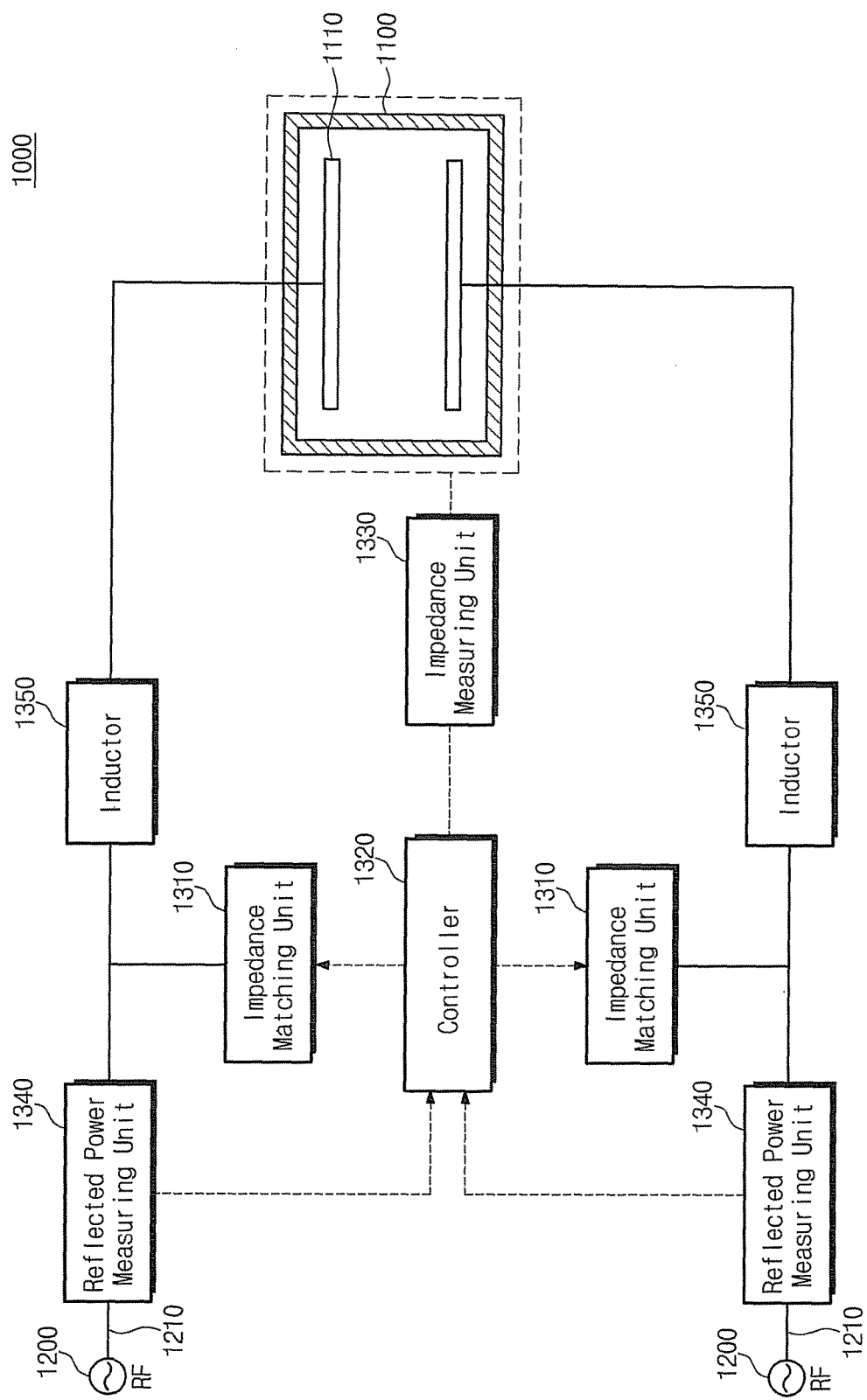
FIGS. 2 and 3 are block diagrams of a substrate treating apparatus according to other embodiments of the inventive concept.
Figure 3:
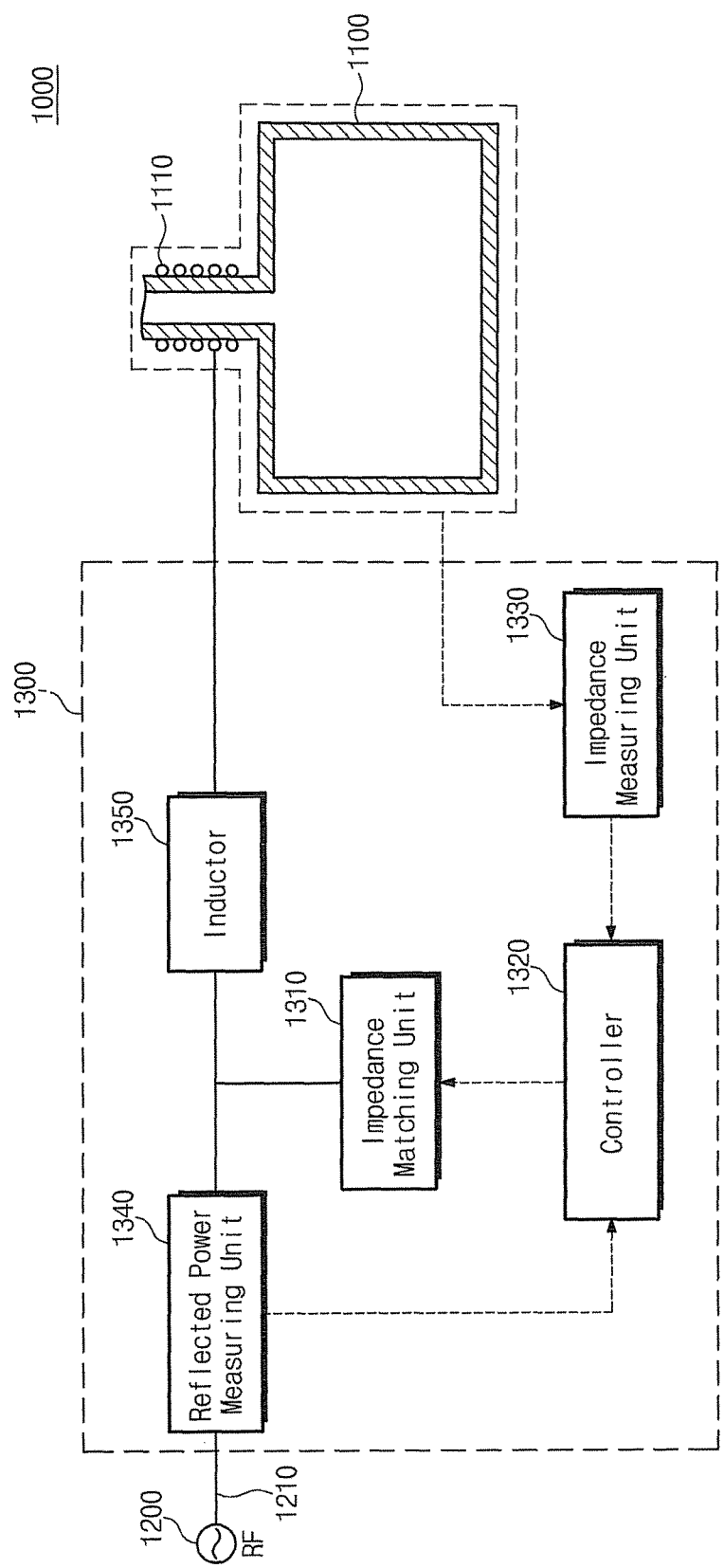

FIGS. 2 and 3 are block diagrams of a substrate treating apparatus according to other embodiments of the inventive concept.

Referring to FIG. 2, a CCP source is configured such that an RF power supply 1200 is connected to two electrode plates. Herein, the RF power supply 1200 may be configured to apply RF powers having difference frequencies.

An electrode 1110 may be an Inductively Coupled Plasma (hereinafter, referred to as ICP) source which is formed of an inductive coil provided outside a process chamber 1100. Referring to FIG. 3, the ICP source supplies an electric energy to electrons of the gas input within the process chamber 1100 using an inductive electric field. The ICP source varies an input gas to a plasma state with a plasma generating device separately coupled to the upside of the process chamber 1100, and provides the plasma to the process chamber 1100 in a downstream manner.

The RF power supply 1200 supplies an RF power to the electrode 1110 within the process chamber 1100 via a transmission line 1210 such that electrons of a gas supplied into the process chamber 1100 is converted into a plasma state. The RF power supply 1200 may supply a power in a pulse mode. For example, the RF power supply 1200 may supply a power in a pulse mode where an RF power supply voltage becomes on and off periodically according to a time. However, the RF power supply 1200 is not limited thereto. For example, the RF power supply 1200 can be configured to supply a power with a continuous frequency.

The transmission line 1210 transmits a power generated by the RF power supply 1200 to the process chamber 1100 via a plasma impedance matching device 1300.

The plasma impedance matching device 1300 matches impedance of an RF power supply side and impedance of a process chamber side.

Below, a plasma impedance matching device according to an embodiment of the inventive concept will be described more fully with reference to accompanying drawings.

The plasma impedance matching device 1300 is disposed between the RF power supply 1200 and the process chamber 1100. The plasma impedance matching device 1300 includes an impedance matching unit 1310, a controller 1320, an impedance measuring unit 1330, a reflected power measuring unit 1340, and an inductor 1350.

The impedance matching unit 1310 makes impedance matching between the RF power supply 1200 and the process chamber 1100 using an adjustable capacitor 1400.

Figure 4:
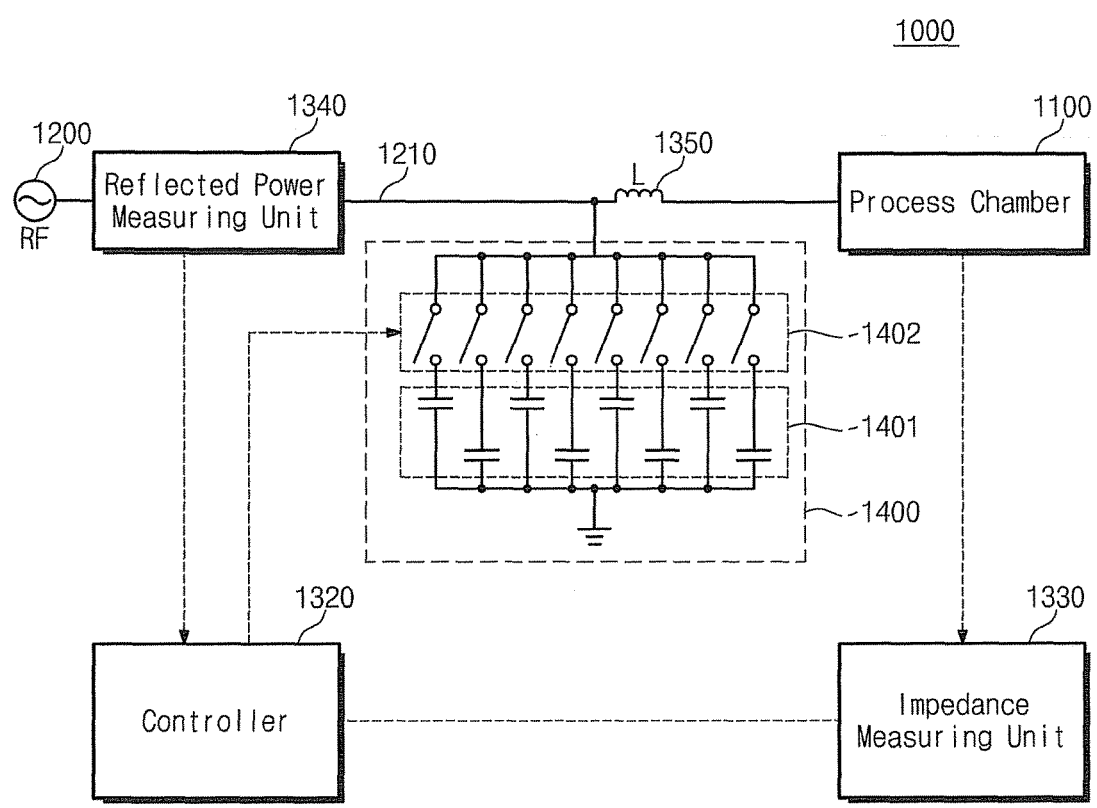
FIG. 4 is a block diagram of a plasma impedance matching device according to an embodiment of the inventive concept.

FIG. 4 is a block diagram of a plasma impedance matching device according to an embodiment of the inventive concept.

An impedance matching unit 1310 is connected to a transmission line 1210, and capacitance is varied according to a control signal from a controller 1320.

The impedance matching unit 1310 includes an adjustable capacitor 1400.

Referring to FIG. 4, the adjustable capacitor 1400 includes a capacitor circuit 1401 and a switch circuit 1402.

The adjustable capacitor 1400 is connected to the transmission line 1210. The capacitor circuit 1401 is connected to the switch circuit 1402 for supplying an RF power from the transmission line 1210. The capacitor circuit 1401 is formed of a plurality of capacitors, and the switch circuit 1402 is formed of a plurality of switches respectively corresponding to the plurality of capacitors. Each of the capacitors is connected to a corresponding one of the switches. Capacitance of the adjustable capacitor 1400 is adjusted by selectively closing the switches of the switch circuit 1402 respectively connected to the plurality of capacitors in the capacitor circuit 1401.

The capacitors in the capacitor circuit 1401 are connected to the transmission line 1210 via the switch circuit 1402. For example, the capacitors in the capacitor circuit 1401 are selectively connected to the transmission line 1210 via turned-on switches in the switch circuit 1402. That is, capacitance of the adjustable capacitor 1400 is determined according to capacitance of capacitors connected to turned-on switches. The capacitors in the capacitor circuit 1401 are connected in parallel. In this case, capacitance of the adjustable capacitor 1400 corresponds to a sum of capacitance of capacitors, connected to turned-on switches, from among the plurality of capacitors in the capacitor circuit 1401. It is easy to calculate capacitance of the adjustable capacitor 1400. However, the adjustable capacitor 1400 is not limited to this disclosure. For example, the adjustable capacitor 1400 can be configured to include a plurality of capacitors connected in series.

The capacitors in the capacitor circuit 1401 may have the same capacitance. Alternatively, some or all of the capacitors in the capacitor circuit 1401 can be formed to have different capacitance. Still alternatively, capacitance of the capacitors in the capacitor circuit 1401 can be determined to be increased sequentially according to an arrangement order. For example, capacitance of the capacitors in the capacitor circuit 1401 can be sequentially increased twice.

A capacitance value of the adjustable capacitor 1400 is finely controlled by combining capacitance of the capacitors in the capacitor circuit 1401. It is assumed that the capacitor circuit 1401 is formed of eight capacitors and a capacitance ratio of the capacitor is 1:2:4:8:16:32:64:128. With this assumption, 256 capacitance values are determined by combining the capacitors in the capacitor circuit 1401.

The switches in the switch circuit 1402 are electrically closed or opened according to a control signal. If a switch is turned on, a corresponding capacitor is supplied with a power from the transmission line 1210. Switches may be configured variously to operate electrically.

Figure 5:
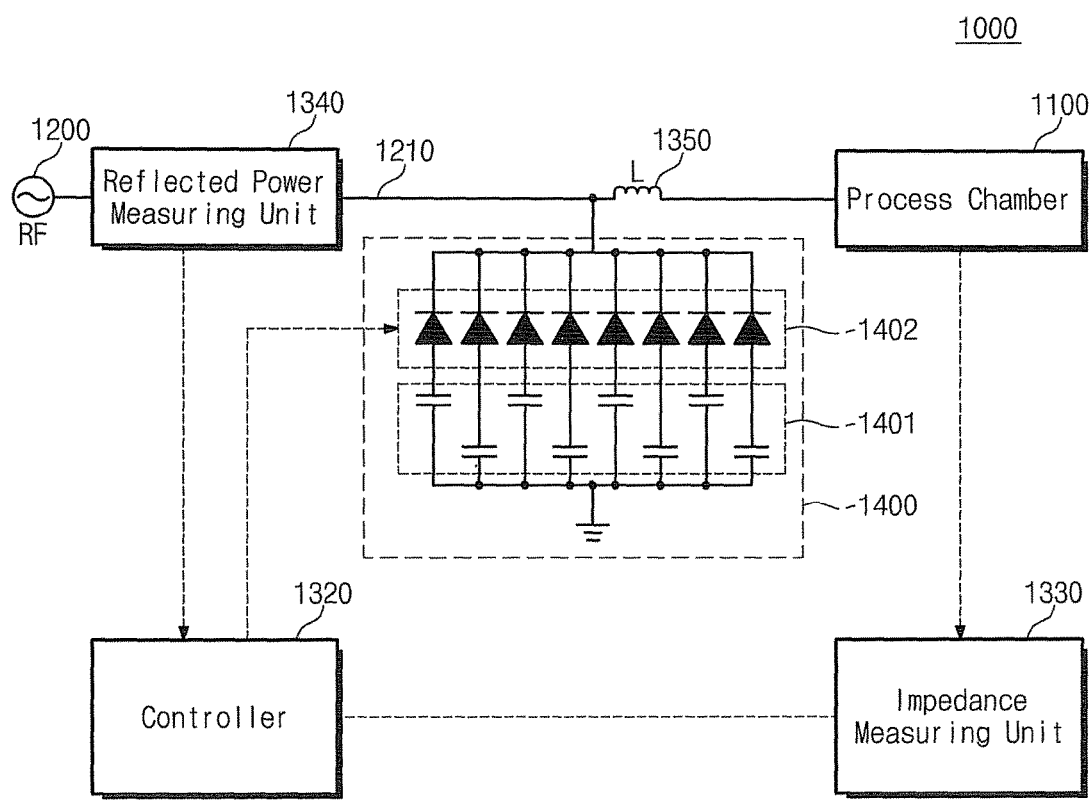
FIG. 5 is a block diagram of a plasma impedance matching device according to another embodiment of the inventive concept.

FIG. 5 is a block diagram of a plasma impedance matching device according to another embodiment of the inventive concept.

Referring to FIG. 5, PIN diodes are used as switches of a switch circuit 1402 that operates electrically.

A controller 1320 receives a value indicating impedance measured within a process chamber 1100 or a value indicating a reflected power from an RF power supply 1200 measured on a transmission line 1210, and provides an impedance matching unit 1310 with a capacitance adjustment value for impedance matching.

The controller 1320 sends an on/off control signal to a switch circuit 1402 of an adjustable capacitor 1400 corresponding to the capacitance adjustment value. In particular, the controller 1320 sends a control signal for selecting capacitors to be connected to the transmission line 1210 from among capacitors in a capacitor circuit 1401 of the adjustable capacitor 1400 according to the capacitance adjustment value. That is, a control signal is sent to the switch circuit 1401 to select capacitors to be connected to the transmission line 1210 from among capacitors in a capacitor circuit 1401 and to turn on switches of the switch circuit 1401 respectively corresponding to the selected capacitors.

The controller 1320 converts an analog signal being a value indicating a measured electrical characteristic of the transmission line 1210 into a digital signal to send it to a switch circuit 1402 of the adjustable capacitor 1400. The switch circuit 1402 operates in response to the digital signal to connect the capacitor circuit 1401 to the transmission line 1210. However, the controller 1320 is not limited to this disclosure. The controller 1320 can be configured to send an analog control signal to the switch circuit 1402.

The controller 1320 determines a capacitance adjustment value for impedance matching between an RF power supply 1200 and a process chamber 1100 in response to a measured value provided from at least one of the impedance measuring unit 1330 and the reflected power measuring unit 1340.

The impedance measuring unit 1330 measures plasma impedance within the process chamber 1100 to send it to the controller 1320.

The reflected power measuring unit 1340 measures an electric characteristic of an RF power of the transmission line 1210 to provide it to the controller 1320. Herein, an electric characteristic of an RF power measured on the transmission line may be a current, a voltage, a phase difference thereof. The reflected power measuring unit 1340 measures a reflected power output from the RF power supply 1200 based on the electric characteristic.

An inductor 1350 eliminates a DC component of an RF power output from the adjustable capacitor 1400. The inductor 1350 can be formed of an adjustable inductor for impedance matching.

Below, an operation of a plasma impedance matching device according to an embodiment of the inventive concept will be more fully described with reference to accompanying drawings.

Figure 6:
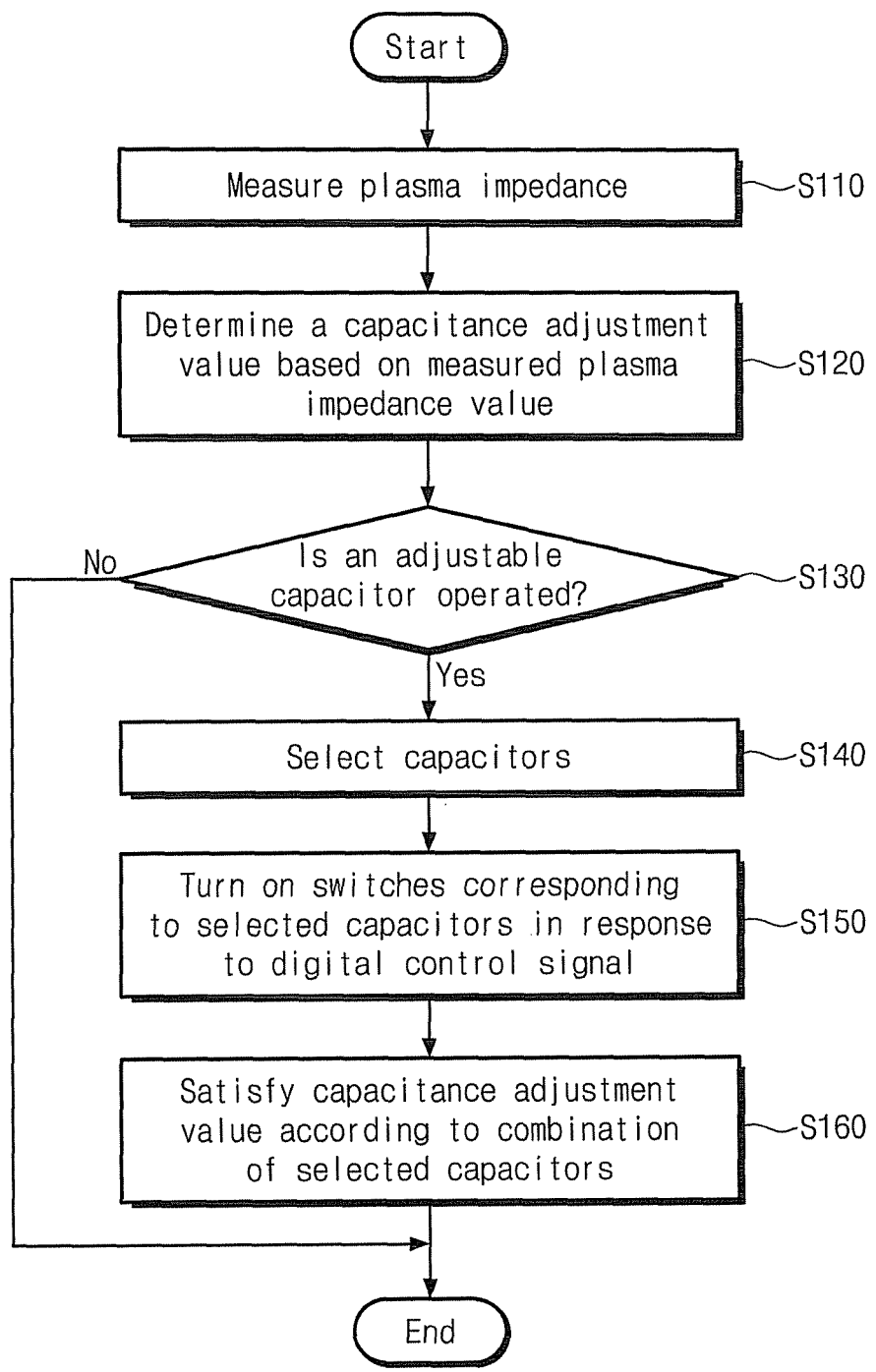
FIG. 6 is a flowchart for describing an operation of a plasma impedance matching device in FIG. 4.

FIG. 6 is a flowchart for describing an operation of a plasma impedance matching device in FIG. 4.

Referring to FIG. 6, an RF power supply 1200 supplies an RF power to an electrode 1110 via a transmission line 1210. At this time, a gas input into a process chamber 1100 is converted into a plasma state by an electric energy. The process chamber 1100 performs a substrate treating process using plasma. In operation S110, an impedance measuring unit 1330 measures plasma impedance within the process chamber 1100 to provide it to a controller 1320. In operation S120, the controller 1320 determines a capacitance adjustment value according to the input plasma impedance measurement value. At this time, a reflected power measuring unit 1340 measures an electric characteristic of a transmission line 1210 to provide it to the controller 1320. The controller 1320 can determine the capacitance adjustment value further in view of an electric characteristic of an RF power, for example, a current, a voltage, a phase difference, or the like.

In operation S130, the controller 1320 determines whether or not to adjust capacitance of an adjustable capacitor 1400 within an impedance matching unit 1310 according to the capacitance adjustment value. In case that adjustment of capacitance of the adjustable capacitor 1400 is not required, the method is ended. In case that adjustment of capacitance of the adjustable capacitor 1400 is required, in operation S140, capacitors to be connected to a transmission line 1210 are selected such that capacitance is adjusted to correspond to the capacitance adjustment value. In operation S150, the controller 1320 sends a digital control signal to a switch circuit 1402 such that the selected capacitors are connected to the transmission line 1210. In operation S160, the selected capacitors connected to turned-on switches satisfy a capacitance adjustment value necessary for plasma impedance matching according to a capacitance combination.

In case that plasma impedance within the process chamber 1100 is not matched with impedance of the RF power 1200, plasma impedance is matched using the adjustable capacitor 1400 of the plasma impedance matching device 1300.

Below, a plasma impedance matching device according to another embodiment of the inventive concept will be more fully described with reference to accompanying drawings. The plasma impedance matching device according to another embodiment of the inventive concept may be similar to that according to an embodiment of the inventive concept, and a difference may be focused.

Figure 7:
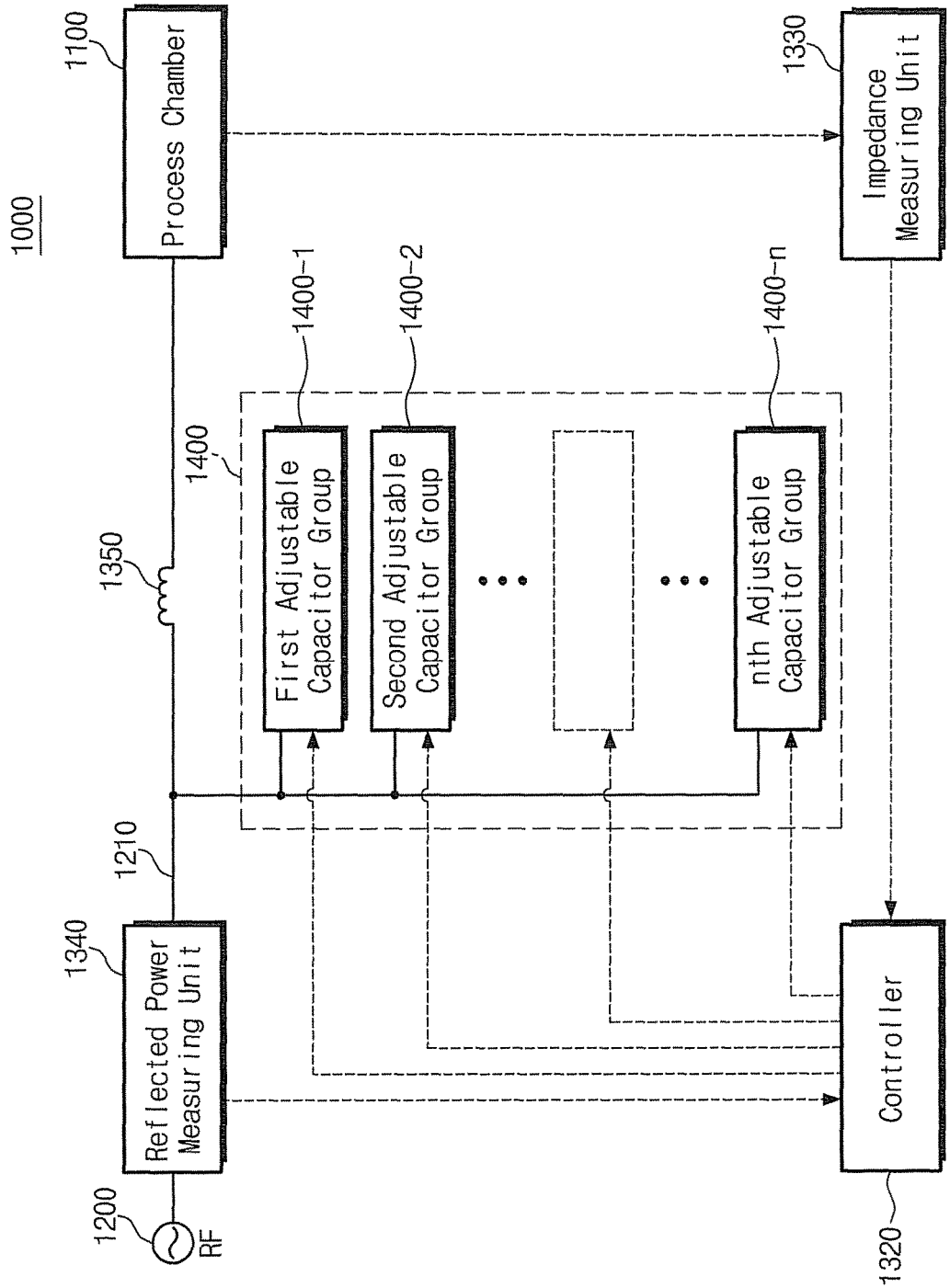
FIG. 7 is a block diagram schematically illustrating a plasma impedance matching device according to another embodiment of the inventive concept.

FIG. 7 is a block diagram schematically illustrating a plasma impedance matching device according to another embodiment of the inventive concept.

A plasma impedance matching device 1300 according to another embodiment of the inventive concept includes an adjustable capacitor 1400 which is formed of N adjustable capacitor groups 1400-1 through 1400-$n$ that are connected in parallel.

Further, the plasma impedance matching device 1300 can comprise further adjustable capacitors that are configured to be identical to that 1400 illustrated in FIG. 7.

Adjustable capacitance ranges of the adjustable capacitor groups 1400-1 through 1400-$n$ may be different from each other.

When capacitance capable of being adjusted at a plasma impedance matching device 1300 has capacitance corresponding to a number of $10^{n-1}$, capacitance corresponding to a number of 1 of a capacitance adjustment value is adjusted by a first adjustable capacitor group 1400-1, capacitance corresponding to a number of 10 of the capacitance adjustment value is adjusted by a second adjustable capacitor group 1400-2, capacitance corresponding to a number of $10^2$ of the capacitance adjustment value is adjusted by a third adjustable capacitor group 1400-2, and capacitance corresponding to a number of $10^{n-1}$ of the capacitance adjustment value is adjusted by an nth adjustable capacitor group 1400-$n$. That is, capacitance ranges of the capacitor groups 1400-1 through 1400-$n$ are determined. For example, in case that a capacitance adjustment value is 123, the first adjustable capacitor group 1400-1 adjusts a value of 3 using capacitors, the second adjustable capacitor group 1400-2 adjusts a value of 20 using capacitors, and the third adjustable capacitor group 1400-3 adjusts a value of 100 using capacitors.

Each of the adjustable capacitor groups 1400-1 through 1400-$n$ may be formed of a capacitor circuit 1401 and a switch circuit 1402.

Figure 8:
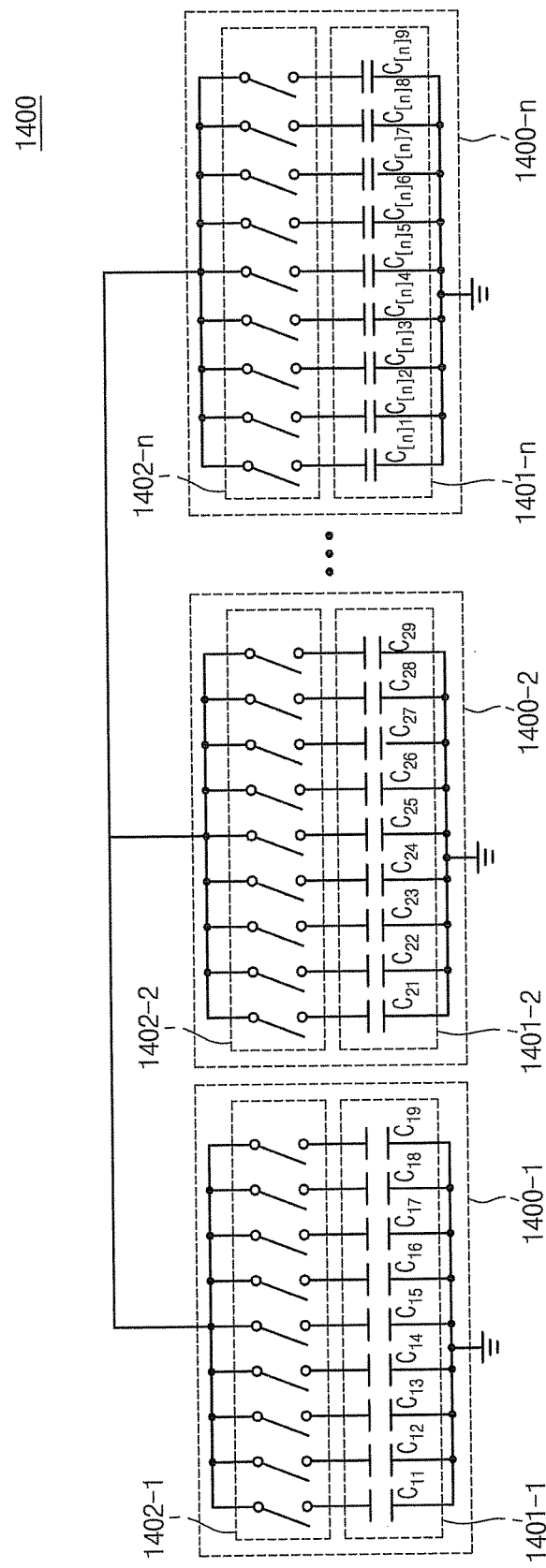
FIG. 8 is a circuit diagram schematically illustrating an adjustable capacitor in FIG. 7 according to an embodiment of the inventive concept.

FIG. 8 is a circuit diagram schematically illustrating an adjustable capacitor in FIG. 7 according to an embodiment of the inventive concept.

Referring to FIG. 8, an adjustable capacitor group 1400-1 is configured such that a capacitor circuit 1401-1 is connected to a switch circuit 1402-1 for supplying an RF power from a transmission line 1210. The capacitor circuit 1401-1 is formed of a plurality of capacitors corresponding to a plurality of switches of the switch circuit 1402-1, respectively. Remaining adjustable capacitor groups 1400-2 through 1400-$n$ are configured the same as the adjustable capacitor group 1400-1. Capacitance of each of the adjustable capacitor groups 1400-1 through 1400-$n$ is adjusted by selectively closing switches of a corresponding switch circuit connected to capacitors of a corresponding capacitor circuit.

Capacitors within each of the adjustable capacitor groups 1400-1 through 1400-$n$ are connected in parallel each other.

In this case, capacitance of the adjustable capacitor groups 1400-1 through 1400-$n$ is obtained by summing capacitance of capacitors connected to turned-on switches.

Capacitors within the same group may have the same capacitance. The adjustable capacitor groups 1400-1 through 1400-$n$ include capacitor circuits 1401-1 through 1401-$n$ each of which is formed of nine capacitors.

The first adjustable capacitor group 1400-1 includes nine capacitors $C_{11}$ through $C_{19}$ each having capacitance of 1. The second adjustable capacitor group 1400-2 includes nine capacitors $C_{21}$ through $C_{29}$ each having capacitance of 10. The third adjustable capacitor group 1400-3 includes nine capacitors $C_{31}$ through $C_{39}$ each having capacitance of $10^2$. The nth adjustable capacitor group 1400-$n$ includes nine capacitors $C_{[n]1}$ through $C_{[n]9}$ each having capacitance of $10^{n-1}$.

Capacitance of the first adjustable capacitor group 1400-1 is adjusted from 1 to 9 by a combination of capacitors, connected to turned-on switches, from among the capacitors $C_{11}$ through $C_{19}$ each having capacitance of 1. Capacitance of the second adjustable capacitor group 1400-2 is adjusted from 10 to 90 by a combination of capacitors, connected to turned-on switches, from among the capacitors $C_{21}$ through $C_{29}$ each having capacitance of 10. Capacitance of the third adjustable capacitor group 1400-3 is adjusted from $10^2$ to $9 \times 10^2$ by a combination of capacitors, connected to turned-on switches, from among the capacitors $C_{31}$ through $C_{39}$ each having capacitance of $10^2$. Capacitance of the nth adjustable capacitor group 1400-$n$ is adjusted from $10^{n-1}$ to $9 \times 10^{n-1}$ by a combination of capacitors, connected to turned-on switches, from among the capacitors $C_{[n]1}$ through $C_{[n]9}$ each having capacitance of $10^{n-1}$. For example, in case that a capacitance adjustment value is 123, capacitance of the first adjustable capacitor group 1400-1 is adjusted to a value of 3 by turning on three switches each connected with a capacitor having a capacitance of 1, capacitance of the second adjustable capacitor group 1400-2 is adjusted to a value of 20 by turning on two switches each connected with a capacitor having a capacitance of 10, and capacitance of the third adjustable capacitor group 1400-3 is adjusted to a value of 100 by turning on one switch connected with a capacitor having a capacitance of 100.

Fine controlling of a capacitance value of the adjustable capacitor 1400 is made by combining capacitance of capacitor circuits 1401-1 through 1401-$n$ of the adjustable capacitor groups 1400-1 through 1400-$n$.

In example embodiments, a controller 1320 outputs a control signal for selecting capacitors, to be connected to a transmission line, from among capacitors of a capacitor circuit 1401 of an adjustable capacitor 1400. In particular, a control signal is sent to the switch circuit 1401 to select capacitors to be connected to the transmission line 1210 from among capacitors in the capacitor circuit 1401 and to turn on switches of the switch circuit 1401 respectively corresponding to the selected capacitors.

Herein, switches of the switch circuit 1402 may be formed of an electric switch as described above.

Figure 9:
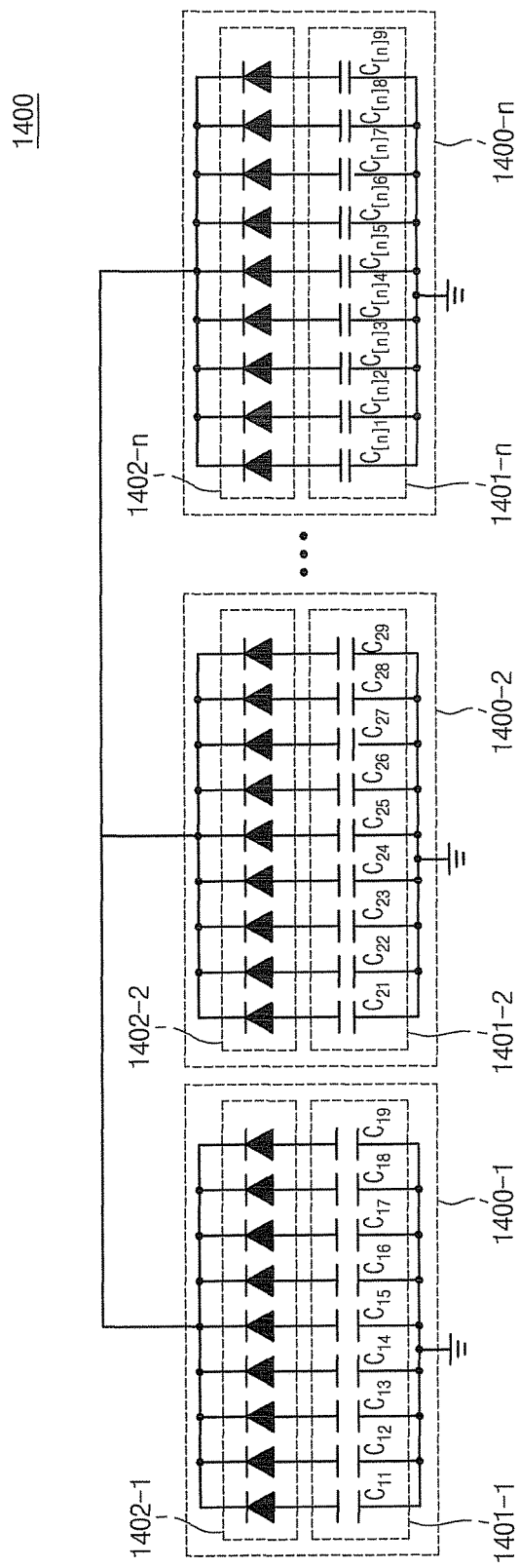
FIG. 9 is a circuit diagram schematically illustrating an adjustable capacitor in FIG. 7 according to another embodiment of the inventive concept.

FIG. 9 is a circuit diagram schematically illustrating an adjustable capacitor in FIG. 7 according to another embodiment of the inventive concept.

Referring to FIG. 9, switches of a switch circuit 1402 are formed of PIN diodes.

Figure 10:
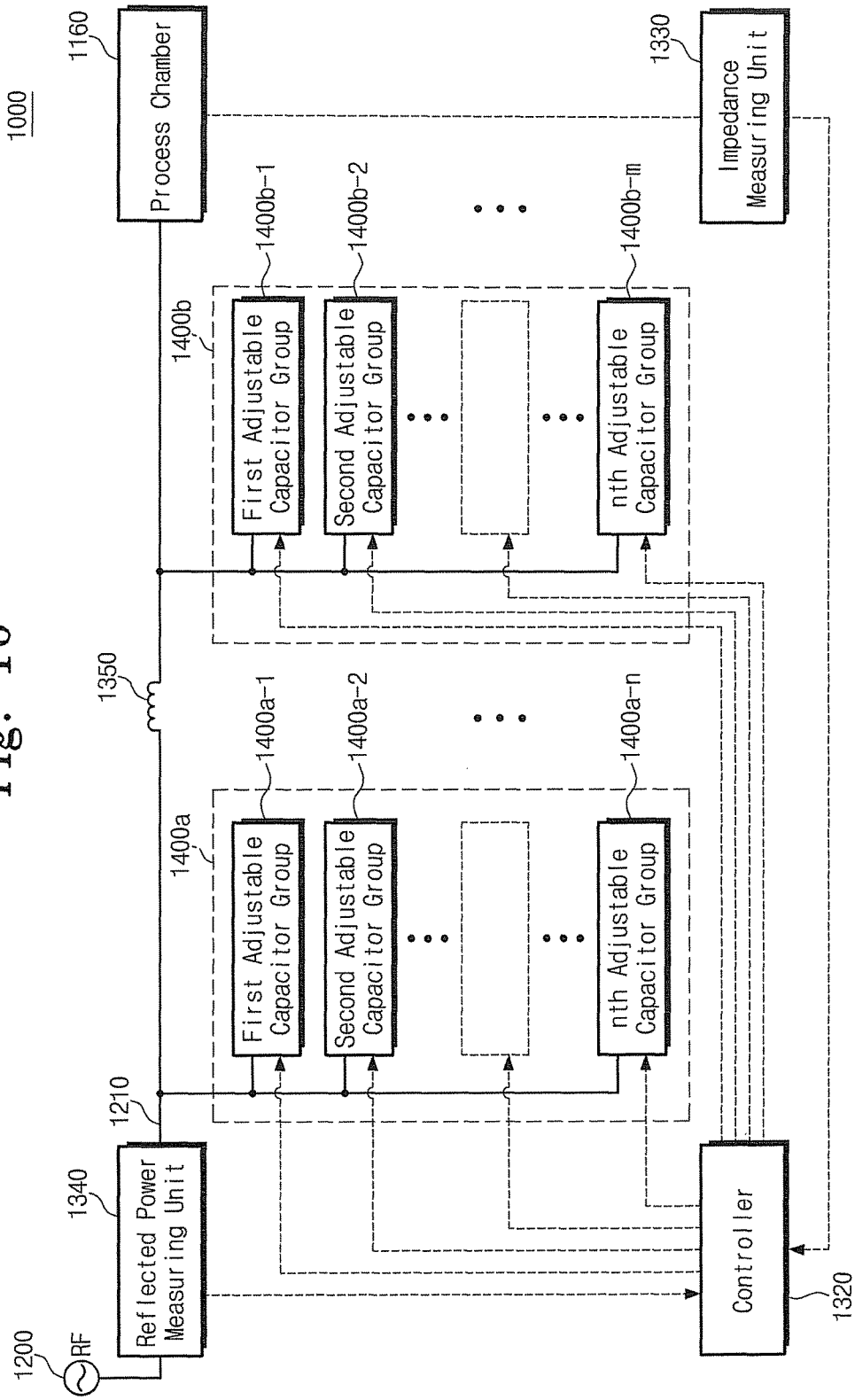
FIG. 10 is a block diagram schematically illustrating a plasma impedance matching device according to still another embodiment of the inventive concept.

FIG. 10 is a block diagram schematically illustrating a plasma impedance matching device according to still another embodiment of the inventive concept.

Referring to FIG. 10, a plasma impedance matching device includes two adjustable capacitors 1400$a$ and 1400$b$.

The adjustable capacitor 1400a includes N adjustable capacitor groups 1400a-1 through 1400a-n, and the adjustable capacitor 1400b includes M adjustable capacitor groups 1400b1 through 1400b-m. Herein, M is equal to or different from N. The adjustable capacitors 1400a and 1400b are connected in parallel with respect to a transmission line 1210.

Below, a plasma impedance matching device according to another embodiment of the inventive concept will be more fully described with reference to accompanying drawings. The plasma impedance matching device according to another embodiment of the inventive concept may be similar to that according to an embodiment of the inventive concept, and a difference may be focused.

In case that an operation of an adjustable capacitor 1400 is decided after execution of the above-described operations S110 through S130, capacitors to be connected to a transmission line 1210 from among capacitors within adjustable capacitor groups 1400-1 through 1400-n are selected according to a capacitance adjustment value. A controller 1320 sends a digital control signal to switches corresponding to the selected capacitors so as to be turned on. The capacitors connected with the turned-on switches may satisfy the capacitance adjustment value for plasma impedance matching according to a capacitance combination.

In particular, in case that a capacitance adjustment value has capacitance of a number of $10^{n-1}$ when selecting capacitors within the adjustable capacitor groups 1400-1 through 1400-n, whether or not to operate the adjustable capacitor groups 1400-1 through 1400-n is determined such that capacitance corresponding to a number of 1 of a capacitance adjustment value is adjusted by a first adjustable capacitor group 1400-1, that capacitance corresponding to a number of 10 of the capacitance adjustment value is adjusted by a second adjustable capacitor group 1400-2, that capacitance corresponding to a number of $10^2$ of the capacitance adjustment value is adjusted by a third adjustable capacitor group 1400-2, and that capacitance corresponding to a number of $10^{n-1}$ of the capacitance adjustment value is adjusted by an nth adjustable capacitor group 1400-n.

As described above, in case that plasma impedance of a process chamber 1100 is not matched with impedance of an RF power supply 1200, plasma impedance is matched using the adjustable capacitor 1400 of the plasma impedance matching device 1300.

Below, a plasma impedance matching device according to still another embodiment of the inventive concept will be more fully described with reference to accompanying drawings. The plasma impedance matching device according to still another embodiment of the inventive concept may be similar to that according to an embodiment of the inventive concept, and a difference may be focused.

Figure 11:
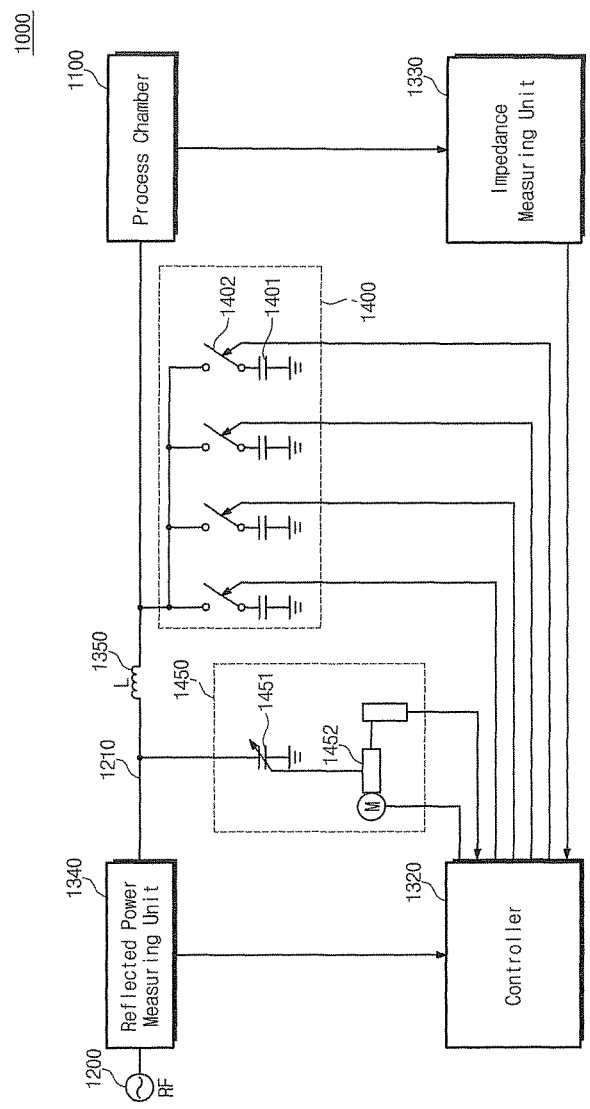
FIG. 11 is a block diagram schematically illustrating a plasma impedance matching device according to still another embodiment of the inventive concept.

FIG. 11 is a block diagram schematically illustrating a plasma impedance matching device according to still another embodiment of the inventive concept.

Referring to FIG. 11, a plasma impedance matching device 1300 according to still another embodiment of the inventive concept further includes a mechanical adjustable capacitor 1450.

The mechanical adjustable capacitor 1450 and an adjustable capacitor 1400 are connected in parallel. The mechanical adjustable capacitor 1450 and the adjustable capacitor 1400 are connected in parallel to a transmission line 1210 for transmitting an RF power to a process chamber. However, the mechanical adjustable capacitor 1450 and the adjustable capacitor 1400 can be connected in series.

The mechanical adjustable capacitor 1450 includes a capacitor 1451 and a mechanical driving means 1452.

Capacitance of the capacitor 1451 is adjusted by the mechanical driving means 1452. The mechanical driving means 1452 may be formed of a mechanical driving means that has a stepping motor and a gear stage. The motor makes rotation driving according to an input control signal, and the gear stage rotated by the motor adjusts an interval of the capacitor 1451.

The mechanical adjustable capacitor 1450 and the adjustable capacitor 1400 may operate in a master-slave manner. The adjustable capacitor 1400 operates to be dependent upon the mechanical adjustable capacitor 1450. The mechanical adjustable capacitor 1450 automatically adjusts capacitance via a mechanical driving means according to a capacitance adjustment value needed to adjust impedance of an RF power supply 1200, and then the remaining capacitance is finely controlled by the adjustable capacitor 1450. Capacitance, which is not finely adjusted by the mechanical adjustable capacitor 1450 controlling capacitance via the mechanical driving means 1452, may be finely adjusted by combining capacitance of capacitors connected to switches that are turned on according to an electric signal.

Further, the mechanical adjustable capacitor 1450 is used when a power of the RF power supply 1200 is varied within a wide range, and the adjustable capacitor 1400 is used when a power of the RF power supply 1200 is varied within a narrow range. For example, the mechanical adjustable capacitor 1450 is used at an initial process where a state of a process gas is largely varied, and then fine adjustment is made by the adjustable capacitor 1400.

In example embodiments, a controller 1320 sends a driving control signal of the mechanical driving means 1452 of the mechanical adjustable capacitor 1450 according to a capacitance adjustment value, and outputs an on/off control signal of a switch circuit 1402 of the adjustable capacitor 1400.

Below, a plasma impedance matching device according to still another embodiment of the inventive concept will be more fully described with reference to accompanying drawings. The plasma impedance matching device according to still another embodiment of the inventive concept may be similar to that according to an embodiment of the inventive concept, and a difference may be focused.

Figure 12:
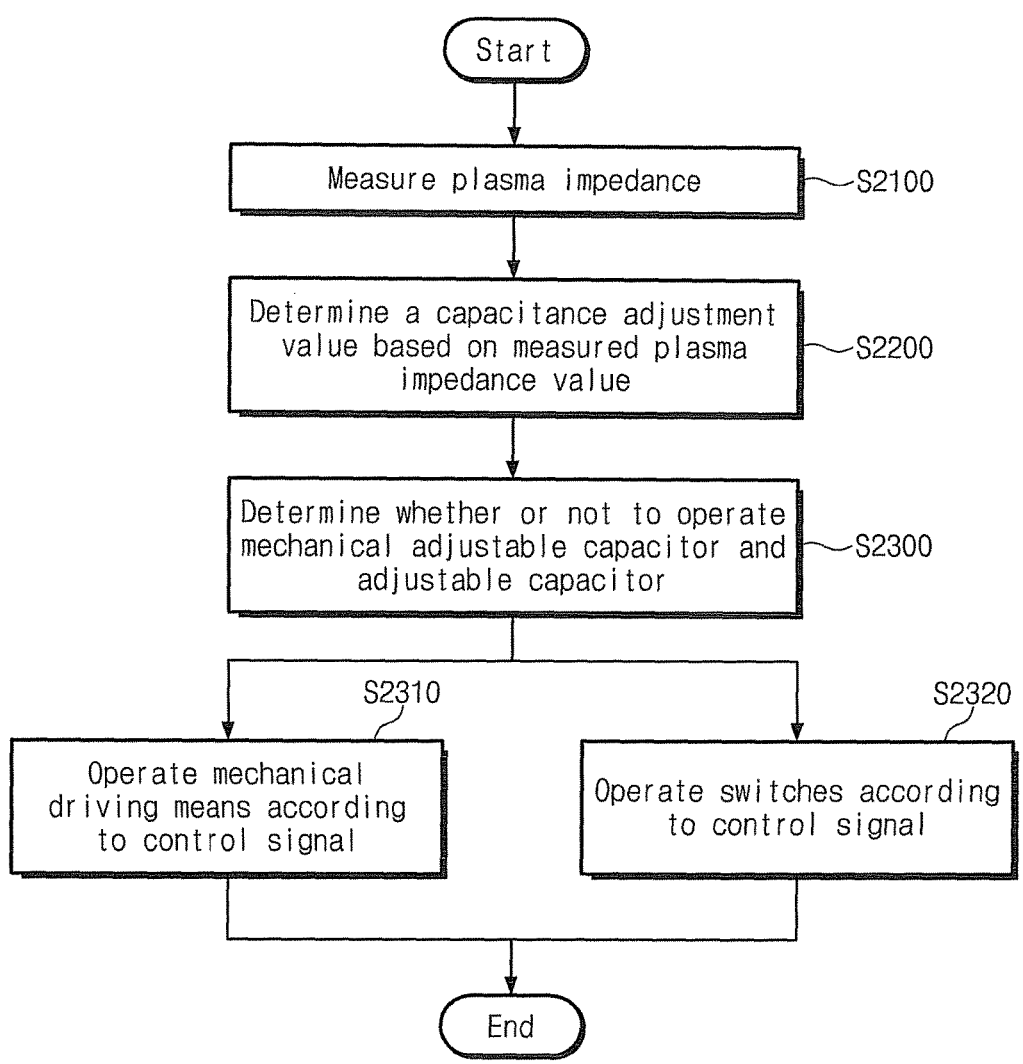
FIGS. 12 through 14 are flowcharts for describing an operation of a plasma impedance matching device in FIG. 11.
Figure 13:
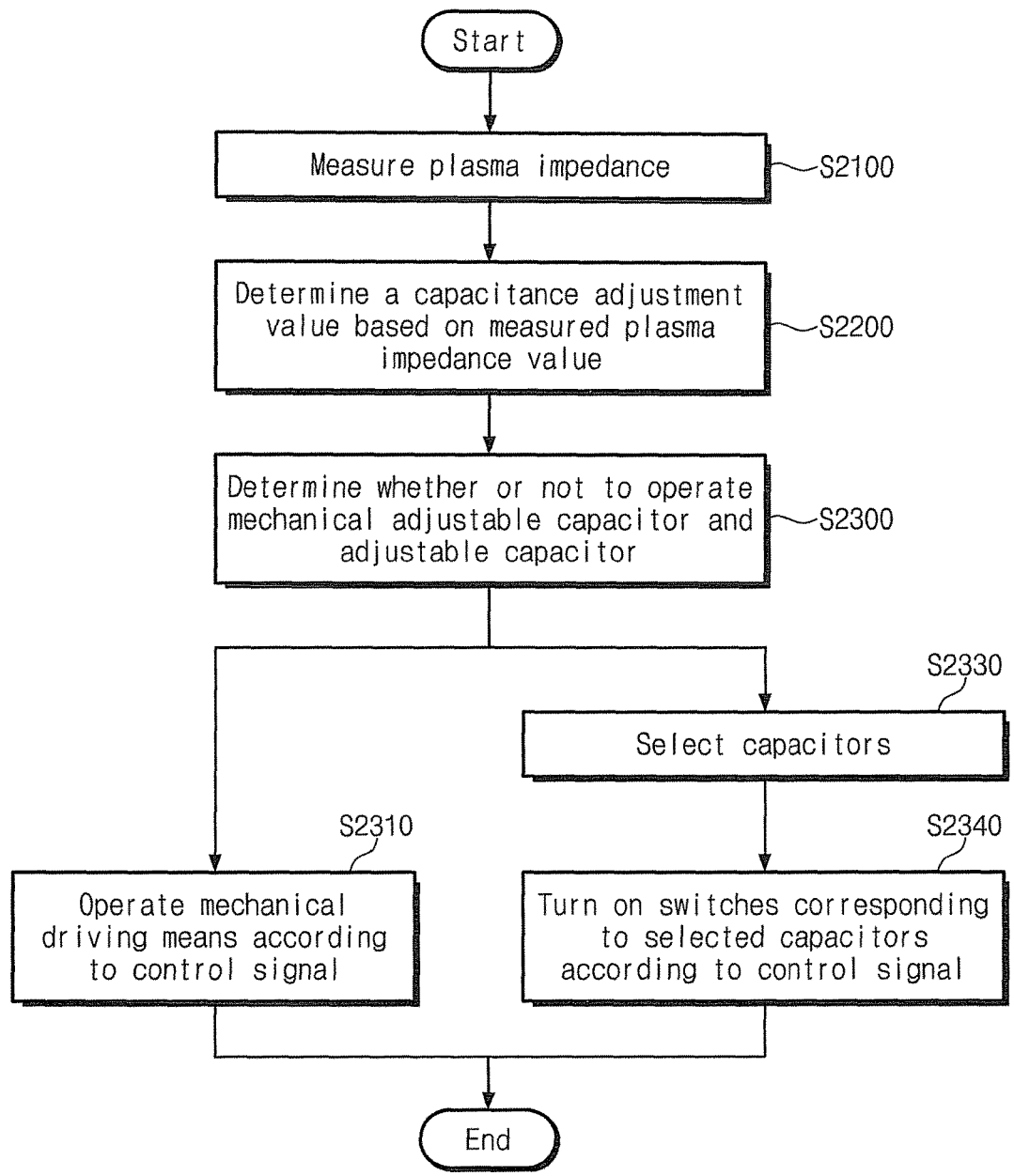
Figure 14:
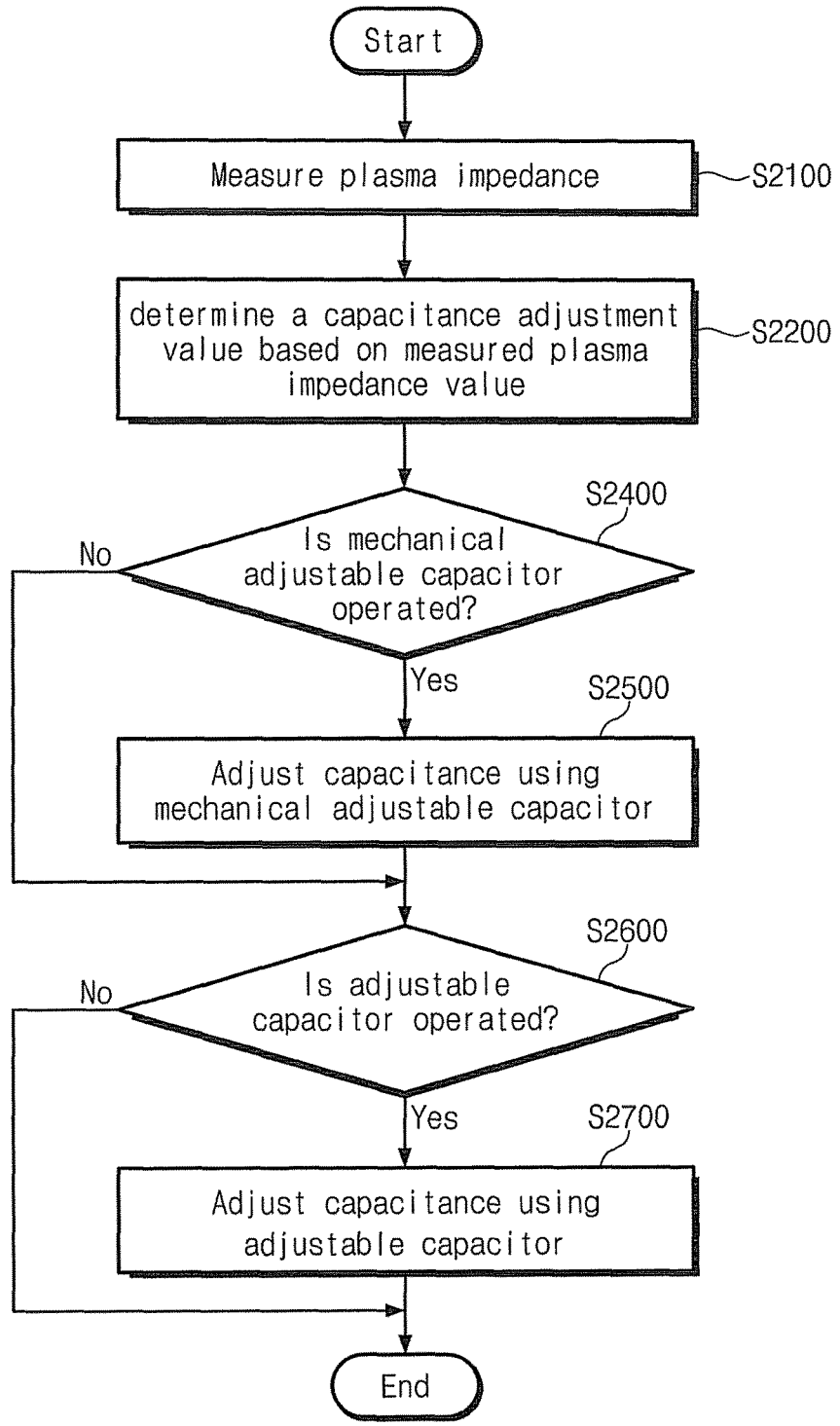

FIGS. 12 through 14 are flowcharts for describing an operation of a plasma impedance matching device in FIG. 11.

Referring to FIG. 12, operations S2100 and S2200 may be carried out to be similar to operations S110 and S120 described in FIG. 6. If a capacitance adjustment value is determined according to the above operations S2100 and S2200, in operation S2300, a controller 1320 determines operations of a mechanical adjustable capacitor 1450 and an adjustable capacitor 1400. If an operation of the mechanical adjustable capacitor 1450 is required, the method proceeds to operation S2310, in which the controller 1320 sends an operating control signal to the mechanical driving means 1452 according to the capacitance adjustment value. If an operation of the adjustable capacitor 1400 is required, the method proceeds to operation S2320, in which the controller 1320 sends an operating control signal to switches of a switch circuit 1401 according to the capacitance adjustment value.

Herein, in case that the operations of the mechanical adjustable capacitor 1450 and the adjustable capacitor 1400 are not required, the above-described operations may be skipped.

Referring to FIG. 13, in case that the adjustable capacitor 1400 is formed of a plurality of capacitors, an operation of the adjustable capacitor 1400 is decided, and the method proceeds to operation S2330, in which capacitors to be connected to a transmission line from among capacitors of a capacitor circuit 1401 are selected. In operation S2340, a controller 1320 outputs an operating control signal to switches corresponding to the selected capacitors. Accordingly, the adjustable capacitor 1400 satisfies a capacitance adjustment value via a capacitance combination of the selected capacitors connected to turned-on switches.

As described above, a mechanical adjustable capacitor 1450 and an adjustable capacitor 1400 can be controlled in a master-slave manner.

Referring to FIG. 14, in operation S2400, a controller 1320 determines whether or not to operate a mechanical adjustable capacitor 1450. If an operation of the mechanical adjustable capacitor 1450 is required, the method proceeds to operation S2500, in which capacitance is adjusted by the mechanical adjustable capacitor 1450. Afterward, the method proceeds to operation S2600. If an operation of the mechanical adjustable capacitor 1450 is not required, the method proceeds to operation S2600. In operation S2600, the controller 1320 determines whether or not to operate an adjustable capacitor 1400 according to the capacitance adjusted by the mechanical adjustable capacitor 1450. If an operation of the adjustable capacitor 1400 is required, the method proceeds to operation S2700, in which the capacitance coarsely adjusted by the mechanical adjustable capacitor 1450 is finely adjusted by the adjustable capacitor 1400 according to the capacitance adjustment value. Thus, the capacitance adjustment value necessary for impedance matching is satisfied.

As described above, if plasma impedance of a process chamber 1100 is not matched with impedance of an RF power supply 1200, plasma impedance is matched using the mechanical adjustable capacitor 1450 and the adjustable capacitor 1400 of the plasma impedance matching device 1300.

Below, a substrate treating apparatus according to another embodiment of the inventive concept will be more fully described with reference to accompanying drawings. The substrate treating apparatus according to another embodiment of the inventive concept may be similar to that according to an embodiment of the inventive concept, and a difference may be focused.

Figure 15:
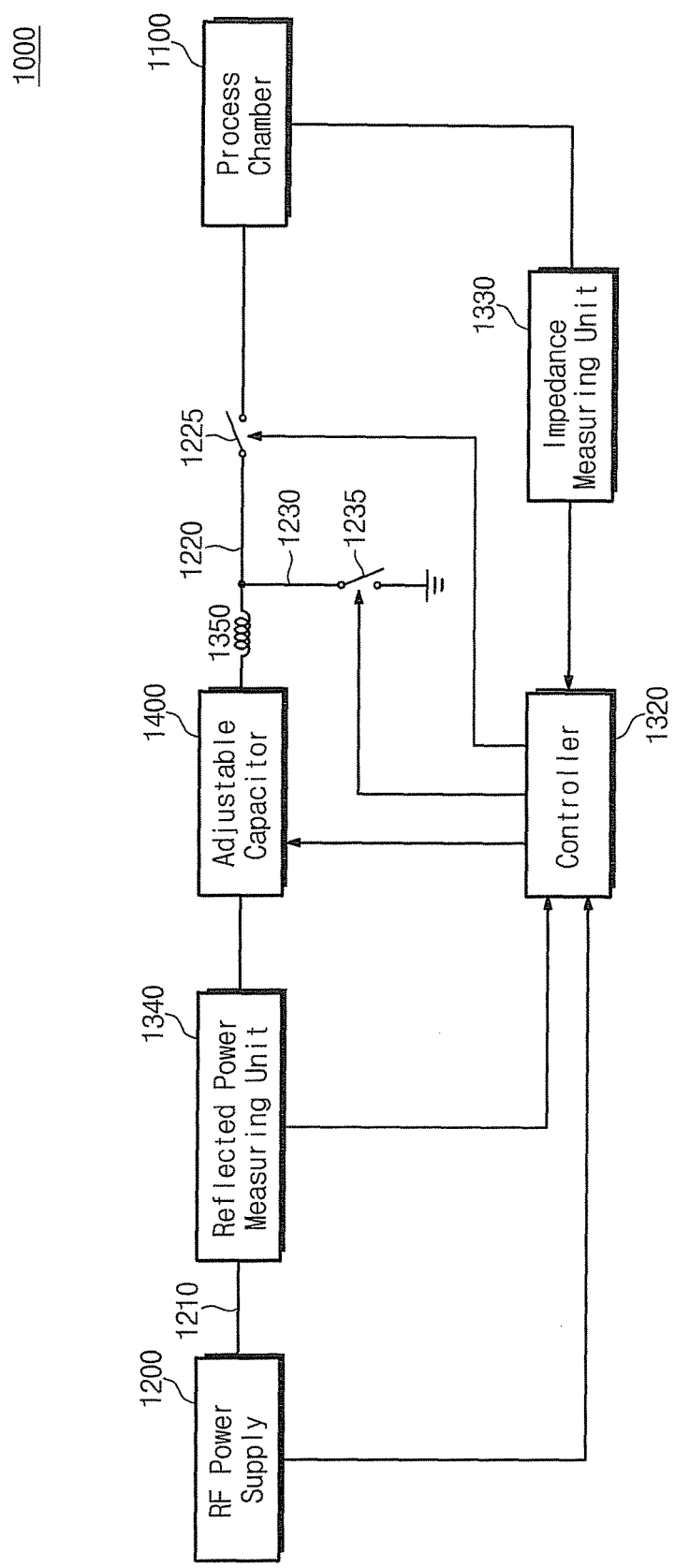
FIG. 15 is a block diagram schematically illustrating a substrate treating apparatus according to another embodiment of the inventive concept.

FIG. 15 is a block diagram schematically illustrating a substrate treating apparatus according to another embodiment of the inventive concept.

Referring to FIG. 15, an RF transmission line 1210 of a substrate treating apparatus 1000 includes according to another embodiment of the inventive concept includes a first transmission line 1220 and a second transmission line 1230. The substrate treating apparatus 1000 further includes a first transmission switch 1225 provided at the first transmission line 1220 and a second transmission switch 1235 provided at the second transmission line 1230.

The first transmission line 1220 connects an adjustable capacitor 1400 and a process chamber 1100. The first transmission switch 1225 is provided on the first transmission line 1220. The first transmission switch 1225 selectively supplies an RF power to the process chamber 1100 via a switching operation. The first transmission switch 1225 may be formed of a PIN diode.

The second transmission line 1230 is diverged from the first transmission line 1220 and is connected between the first transmission line 1220 and a ground. The second transmission switch 1235 is provided on the second transmission line 1230. The second transmission switch 1235 discharges a power to the ground via a switching operation. The second transmission switch 1235 may be formed of a PIN diode.

The second transmission line 1230 can be diverged from the first transmission line 1220 before a power is transferred to the first transmission line 1225. That is, the first transmission switch 1225 is located after a connection node (a diverging node) between the first transmission line 1220 and the second transmission line 1230.

A controller 1320 outputs an on/off signal to the first and second transmission switches 1225 and 1235 according to a pulse mode of an RF power supply 1200.

In case that a pulse mode of the RF power supply 1200 is at an on state, the controller 1320 outputs an on signal to the first transmission switch 1225 and an off signal to the second transmission switch 1235. In case that the pulse mode of the RF power supply 1200 is at an off state, the controller 1320 outputs an off signal to the first transmission switch 1225 and an on signal to the second transmission switch 1235.

Below, an operation of a substrate treating apparatus according to another embodiment of the inventive concept will be more fully described with reference to accompanying drawings. An operation of the substrate treating apparatus according to another embodiment of the inventive concept may be similar to that according to embodiments of the inventive concept, and a difference may be focused.

An RF power supply 1200 supplies an RF power to a transmission line 1210 in a pulse mode. A controller 1320 controls first and second transmission switches 1225 and 1235 according to the pulse mode of the RF power supply 1200. Switch controlling signals of the first and second transmission switches 1225 and 1235 may be complementary.

In case that a pulse mode of the RF power supply 1200 is at an on state, the controller 1320 outputs an on signal to the first transmission switch 1225 and an off signal to the second transmission switch 1235. Thus, an RF power from the RF power supply 1200 is supplied to an electrode 1110 of a process chamber 1100 via an adjustable capacitor 1400 and a first transmission line 1220. At this time, a gas input into the process chamber 1100 is converted into a plasma state by an electric energy. The process chamber 1100 performs a substrate treating process using the plasma.

In case that a pulse mode is at an on state, impedance matching is made by a plasma impedance matching device 1300. This may be performed to be similar to an operation of a plasma impedance matching device according to other embodiments of the inventive concept.

Figure 16:
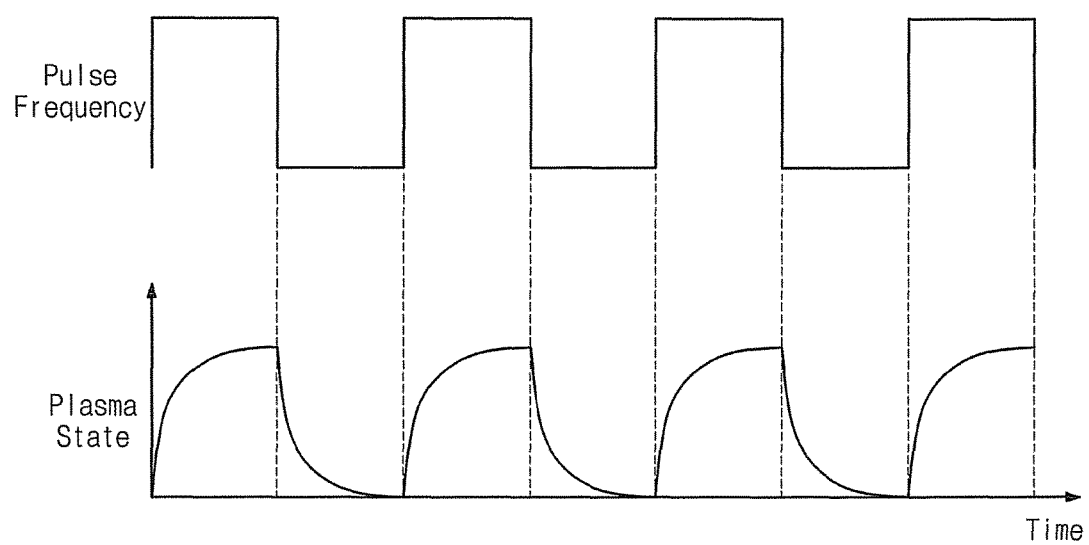
FIG. 16 is a diagram illustrating a variation in a plasma state according to supplying of an RF power in a pulse mode.

FIG. 16 is a diagram illustrating a variation in a plasma state according to supplying of an RF power in a pulse mode.

Referring to FIG. 16, when supplied with an RF power from an RF power supply 1200 in a pulse mode, a plasma impedance matching device 1300 adjusts impedance according to the supplied RF power pulse such that plasma impedance is optimized.

In case that a pulse mode of the RF power supply 1200 is at an on state, a controller 1320 outputs an on signal to a first transmission switch 1225 and an off signal to a second transmission switch 1235. Thus, a power remaining at the adjustable capacitor 1400 without supplying of the RF power from the RF power supply 1200 is discharged to a ground via a second transmission line 1230. Thus, although the RF power is not supplied from the RF power supply 1200, it is possible to prevent a power from being supplied to an electrode 1110 of a process chamber 1100 due to a power remaining at the adjustable capacitor 1400.

With embodiments of the inventive concept, it is possible to adjust capacitance more rapidly and exactly. Further, it is possible to minimize a reflected power by effectively performing plasma impedance matching. Still further, an RF power is effectively supplied to an electrode of a process chamber. Still further, it is possible to effectively control an RF power supplied to a process chamber according to a pulse mode of an RF power supply. Fail caused at a substrate treating process is minimized by minimizing a reflected power.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A substrate treating apparatus comprising:
   a process chamber;
   an electrode configured to generate plasma from a gas supplied into the process chamber;
   an RF power supply configured to output an RF power;
   at least one transmission line configured to transmit the RF power to the electrode from the RF power supply;
   an impedance matching unit connected to the at least one transmission line and configured to match plasma impedance; and
   a controller configured to output a control signal to the impedance matching unit,
   wherein the impedance matching unit comprises,
      a mechanical adjustable capacitor configured to adjust a capacitance of the impedance matching unit by a mechanical driver in a first manner, the driver driven in response to a control signal, and
      at least one adjustable capacitor group configured to adjust the capacitance of the impedance matching unit based on a result of the adjustment of the mechanical adjustable capacitor in a second manner, the second manner of adjustment being a finer adjustment than the first manner of adjustment, the at least one adjustable capacitor group including,
         a plurality of capacitors commonly connected to ground, and
         a plurality of switches corresponding to the plurality of capacitors, respectively, the plurality of switches commonly connected to the at least one transmission line, the plurality of switches switched on/off according to the control signal.

2. The substrate treating apparatus of claim 1, wherein the at least one adjustable capacitor group includes a plurality of capacitor groups, and a number of the plurality of capacitor groups is N (N being an integer bigger than 1), and capacitance ranges adjusted by the respective capacitor groups are different from each other.

3. The substrate treating apparatus of claim 2, wherein the plurality of adjustable capacitor groups are connected in parallel.

4. The substrate treating apparatus of claim 3, wherein the plurality of capacitors in each adjustable capacitor group are connected in parallel.

5. The substrate treating apparatus of claim 4, wherein the plurality of capacitors in each adjustable capacitor group haves a same capacitance.

6. The substrate treating apparatus of claim 5, wherein each adjustable capacitor group includes nine capacitors.

7. The substrate treating apparatus of claim 6, wherein a capacitance ratio of the N adjustable capacitor groups is $10^0:10^1:10^2:10^3 \ldots :10^{N-1}$.

8. The substrate treating apparatus of claim 1, wherein the RF power supply is configured to supply the RF power in a pulse mode.

9. The substrate treating apparatus of claim 8, wherein the at least one transmission line comprises,
   a first transmission line connecting the adjustable capacitor and the process chamber, and
   a second transmission line diverged from the first transmission line to a ground, and
   wherein the substrate treating apparatus further comprises,
   a first transmission switch on the first transmission line, and
   a second transmission switch on the second transmission line, and
   wherein the controller is configured to output an on/off signal to the first transmission switch and the second transmission switch according to the pulse mode of the RF power supply.

10. The substrate treating apparatus of claim 9, wherein the first transmission switch is on the first transmission line and between the process chamber and a connection node between the first transmission line and the second transmission line.

11. A plasma impedance matching device for plasma impedance matching of a substrate treating apparatus, the plasma impedance matching device comprising:
   an impedance matching unit connected to a transmission line of an RF power and configured to match plasma impedance; and
   a controller configured to send a control signal to the impedance matching unit,
   wherein the impedance matching unit comprises,
      a mechanical adjustable capacitor configured to adjust a capacitance of the impedance matching device in a first manner by a mechanical driver, the mechanical driver driven in response to the control signal, and
      at least one adjustable capacitor group configured to adjust the capacitance of the impedance matching device in a second manner based on a result of the adjustment of the mechanical adjustable capacitor and according to the control signal, the second manner of adjustment being a finer adjustment than the first manner of adjustment, the at least one adjustable capacitor group including,
         a plurality of capacitors, and
         a plurality of switches corresponding to the plurality of capacitors, the plurality of switches switched on/off according to the control signal, and
      wherein the plurality of capacitors are commonly connected to ground, and the plurality of switches are commonly connected to a transmission line.

12. The plasma impedance matching device of claim 11, wherein the at least one adjustable capacitor group includes a plurality of capacitor groups, and each of the plurality of capacitors in one adjustable capacitor group among the plurality of capacitor groups the has a capacitance different from that of each of the plurality of capacitors in another adjustable capacitor group among the plurality of capacitor groups.

13. The plasma impedance matching device of claim 12, wherein the plurality of adjustable capacitor groups are connected in parallel.

14. The plasma impedance matching device of claim 13, wherein the plurality of capacitors in each adjustable capacitor group are connected in parallel.

15. The plasma impedance matching device of claim 14, wherein the plurality of capacitors in each adjustable capacitor group has a same capacitance.

16. The plasma impedance matching device of claim 15, wherein each adjustable capacitor group includes nine capacitors.

17. The plasma impedance matching device of claim 16, wherein each of the plurality of switches are formed of a PIN diode.

18. The plasma impedance matching device of claim 11, wherein the plurality of capacitors is connected in parallel.

19. An adjustable capacitor structure for plasma impedance matching of a substrate treating apparatus, the adjustable capacitor structure comprising:
a mechanical adjustable capacitor configured to adjust a capacitance of the adjustable capacitor structure in a first manner by a mechanical driver in response to a control signal; and
at least one adjustable capacitor group configured to adjust the capacitance of the adjustable capacitor structure in a second manner based on a result of the adjustment of the mechanical adjustable capacitor and according to the control signal, the second manner of adjustment being a finer adjustment than the first manner of adjustment, the at least one adjustable capacitor group including,
a plurality of capacitors, and
a plurality of switches respectively connected to the plurality of capacitors, respectively, and the plurality of switches controlled according to the control signal,
wherein the plurality of capacitors of each adjustable capacitor group are commonly connected to ground, and
the plurality of switches of each adjustable capacitor group are commonly connected to a transmission line.

20. The adjustable capacitor of claim 19, wherein the at least one adjustable capacitor group includes a plurality of capacitor groups.

21. The adjustable capacitor structure of claim 20, wherein the plurality of adjustable capacitor groups are connected in parallel.

22. The adjustable capacitor structure of claim 21, wherein the plurality of capacitors in each adjustable capacitor group are connected in parallel.

23. The adjustable capacitor structure of claim 22, wherein the plurality of capacitors in each adjustable capacitor group has a same capacitance.

24. The adjustable capacitor structure of claim 22, wherein each of the plurality of capacitors in one adjustable capacitor group among the plurality of adjustable capacitor groups has a capacitance different from that of each of the plurality of capacitors in another adjustable capacitor group among the plurality of adjustable capacitor groups.

25. The adjustable capacitor structure of claim 23, wherein each adjustable capacitor group includes nine capacitors.

26. The adjustable capacitor structure of claim 25, wherein a number of the plurality of adjustable capacitor groups is N (N being an integer bigger than 1), and a capacitance ratio of the N adjustable capacitor groups is $10^0:10^1:10^2:10^3 \ldots :10^{N-1}$.

27. The adjustable capacitor structure of claim 26, wherein each of the plurality of switches are formed of a PIN diode.

* * * * *